(12) United States Patent
Ward

(10) Patent No.: US 8,171,438 B2
(45) Date of Patent: May 1, 2012

(54) VERIFICATION OF A PROGRAM PARTITIONED ACCORDING TO THE CONTROL FLOW INFORMATION OF THE PROGRAM

(75) Inventor: David Ward, Broomfield, CO (US)

(73) Assignee: International Business Machines Corporation, Armonk, NY (US)

( * ) Notice: Subject to any disclaimer, the term of this patent is extended or adjusted under 35 U.S.C. 154(b) by 1636 days.

(21) Appl. No.: 11/467,493

(22) Filed: Aug. 25, 2006

(65) Prior Publication Data

US 2008/0127106 A1     May 29, 2008

(51) Int. Cl.
    *G06F 17/50*     (2006.01)
    *G06F 9/44*     (2006.01)

(52) U.S. Cl. ........ 716/104; 716/106; 716/132; 716/136; 703/16; 717/104; 717/126; 717/132; 717/144; 717/156

(58) Field of Classification Search ................. 716/104, 716/106, 132, 136; 703/16; 717/104, 126, 717/132, 144, 156
See application file for complete search history.

(56) References Cited

U.S. PATENT DOCUMENTS

| | | | | |
|---|---|---|---|---|
| 5,774,370 | A * | 6/1998 | Giomi | ............................ 716/105 |
| 6,044,211 | A * | 3/2000 | Jain | ............................. 716/102 |
| 6,560,758 | B1 | 5/2003 | Jain | |
| 6,587,998 | B2 | 7/2003 | Rodeh | |
| 6,728,665 | B1 | 4/2004 | Gupta et al. | |
| 6,912,700 | B1 | 6/2005 | Franco et al. | |
| 2003/0225552 | A1 | 12/2003 | Ganai et al. | |
| 2004/0098682 | A1 | 5/2004 | Jain | |
| 2005/0166167 | A1 | 7/2005 | Ivancic et al. | |
| 2006/0085782 | A1 | 4/2006 | Ward | |
| 2006/0129956 | A1 | 6/2006 | Ward | |
| 2007/0240135 | A1 * | 10/2007 | Stoodley et al. | ............... 717/140 |

OTHER PUBLICATIONS

Barner et al., "Efficient Symbolic Model Checking of Software Using Partial Disjunctive Partitioning", IBM Corporation, The 12th Advanced Research Working Conference on Correct Hardware Design and Verifications Methods, CHARME 2003, pp. 1-15.
"Computer Aided Design and Test Decision Diagrams—Concepts and Applications", Report on the Dagstuhl-Seminar, Jan. 31, 1997, pp. 1-18.
Cabodi et al., "Disjunctive Partitioning and Partial Iterative Squaring: an Effective Approach for Symbolic Traversal of Large Circuits", ACM, 1997, pp. 1-6.
Storr, "Planning in the Fluent Calculus Using Binary Decision Diagrams", AI Magazine, Fall, 2001, pp. 1-4.

(Continued)

*Primary Examiner* — Phallaka Kik
(74) *Attorney, Agent, or Firm* — David W. Victor; Konrad Raynes & Victor LLP

(57) ABSTRACT

Provided are a method, system, and article of manufacture for verification of a program partitioned according to the control flow information of the program. Properties are received indicating outcome states for a program. The program is processed to determine a control flow in the program and paths in the control flow. Enabled paths are determined in the control flow having states satisfying requirements of the outcome states. For each enabled path, a determination is made of inert variables not used along the control flow of the path and a representation of states and transitions for the enabled path is generated, wherein the represented states and transitions do not include the inert variables. The generated representation of the states and transitions for the enabled path are combined into a merged computation image.

20 Claims, 4 Drawing Sheets

OTHER PUBLICATIONS

Biere, et al., "Symbolic Model Checking without BDDs", Fifth International Conference on Tools and Algorithms for Construction and Analysis of Systems (TACAS'99), Amsterdam, The Netherlands, Mar. 1999, pp, 193-207.

Bryant, "Graph-Based Algorithms for Boolean Function Manipulation", IEEE Transactions on Computers, Aug. 1986, pp. 677-691.

Burch, et al., "Representing Circuits More Efficiently in Symbolic Model Checking", Proceedings of the Design Automation Conference, San Francisco, California, Jun. 1991, pp. 403-407.

Cabodi, et al., "Improved Reachability Analysis of Large Finite State Machines", IEEE, 1996, pp. 1-7.

Geist, et al., "Efficient Model Checking by Automated Ordering of Transition Relation Partitions", Sixth Conference on Computer Aided Verfication (CAV'94), Berlin, 1994, pp. 299-310.

Higuchi, et al., "Lazy Group Sifting for Efficient Symbolic State Traversal of FSMs", IEEE, 1999, pp. 1-5.

"ITC99 Benchmark Home Page", [online] [retrieved Jul. 29, 2006] http: www.cerc.utexas.edu/itc99-benchmarks/bench.html.

Meinel, et al., "Speeding Up Image Computation by Using RTL Information", Formal Methods in Computer Aided Design, Berlin, Nov. 2000, pp. 443-454.

Meinel, et al., "Hierarchical Image Computation with Dynamic Conjunction Scheduling", Proceedings of the International Conference on Computer Design, Austin, Texas, Sep. 2001, pp. 1-6.

Moon, et al., "Border-Block Triangular Form and Conjunction Schedule in Image Computation", Formal Methods in Computer Aided Design, Nov. 2000, pp. 73-90.

Moon, et al., "To Split or to Conjoin: The Question in Image Computation", ACM, 2000, pp. 1-6.

Narayan, et al., "Partitioned ROBDDs—A Compact, Canonical and Efficiently Manipulable Representation for Boolean Functions", IEEE, 1996, pp. 1-8.

Ranjan, et al., "Efficient BDD Algorithms for FSM Synthesis and Verification", presented at IWLS95, Lake Tahoe, California, May 1995, pp. 1-8.

Ravi, et al., "Approximation and Decomposition of Binary Decision Diagrams", ACM, 1998, pp. 1-6.

Shiple, et al., "Heuristic Minimization of BDDs Using Don't Cares", Design Automation Conference, San Diego, Jun. 1994, pp. 225-231.

Somenzi, "CUDD: CU Decision Diagram Package", Dept. Electrical and Computer Engineering, University of Colorado, Boulder, Colorado, May 1998, pp. 1-47.

Van Eijk, "Formal Methods for the Verification of Digital Circuits", PhD. thesis, Eindhoven University of Technology, The Netherlands, Aug. 1997, pp. 1-156.

U.S. Patent Application entitled "Method for Optimizing Integrated Circuit Device Design and Service", IBM, U.S. Appl. No. 11/250,696, filed Oct. 14, 2005, by inventors.

Feng, et al., "Partitioned Model Checking from Software Specfications", IEEE, 2005, pp. 583-587.

Fraer, et al., "Prioritized Traversal: Efficient Reachability Analysis for Verification and Falsification", 12th Conference on Computer Aided Verification (CAV'00), Jul. 2000, pp. 389-402.

Hong, et al., "Safe BDD Minimization Using Don't Cares", Proceedings of the Design Automation Conference, Anaheim, California, Jun. 1997, pp. 208-213.

Ravi, et al., "High-Density Reachability Analysis", Proceedings of International Conference on Computer-Aided Design, San Jose, California, Nov. 1995, pp. 154-158.

* cited by examiner

```
module example (clock,rst,indat);
            input         clock;
            input [31:0]  indat;
            input         rst;

reg           state;
            reg [31:0]    a,b,c;

initial begin
              state=0; a=0; b=0; c=0;
            end always @ (posedge clock) begin
P1:             if (rst) begin
S1..S4:             a=0; b=0; c=0; state=0;
                end
P2:             if (!state) begin
P3:                 if (a==0)
S5:                     a=indat;
                    else
S6:                     b=a;
                end else begin
P4:                 if (c < 4095)
S7:                     c=c+1;
                end
S8:             state= ~state;
            end
endmodule
```

FIG. 2

VERIFICATION OF A PROGRAM PARTITIONED ACCORDING TO THE CONTROL FLOW INFORMATION OF THE PROGRAM

BACKGROUND OF THE INVENTION

1. Field of the Invention

The present invention relates to verification of a program partitioned according to the control flow information of the program.

2. Description of the Related Art

A hardware description language (HDL), such as Verilog, is used to define and represent a design of an integrated circuit device at various levels of abstraction. As a circuit design evolves, designers and verification engineers (whose job it is to assure that the design functions appropriately) conduct analysis of the device being designed to evaluate the quality of the design and to find and eliminate any program bugs.

Reachability analysis plays a central role in formal verification of sequential circuits. Symbolic algorithms for reachability analysis are used to generate sets of states starting with the initial state until a fix point is reached, i.e., no new states are found. Two common symbolic algorithms include Binary Decision Diagrams (BDDs) and SAT. BDD-based algorithms compute and store the characteristic functions of sets of states in the program. These characteristic functions are represented by Binary Decision Diagrams, which are canonical representations of Boolean functions. Representations of the characteristic functions representing the finite states of the program may have sizes that are not strongly correlated to the cardinalities of the sets they represent, such that very large finite state sets may have very concise descriptions.

Symbolic reachability analysis may consist of a sequence of steps called image computations. If each step operates on the new states reached at the previous step, the result is a symbolic breadth-first search (BFS) of the state space. In BFS, each step determines the successors of a set of states according to a given transition relation. This transition relation is often represented as the implicit conjunction of a set of BDDs and the computation of successors proceeds by a sequence of conjunctions and quantifcations. The largest BDDs manipulated by a symbolic reachability analysis algorithm are often the results obtained halfway through this sequence of operations.

One problem that may occur during reachability analysis is "state explosion", which occurs when an input to the design, intended to permit analysis of the response of the device to a particular input, generates such a large number of possible output or intermediate states as to overrun any memory used in supporting the analysis. This may cause a model checker to run out of memory or spend inordinate amounts of time. With the BDD algorithm, state explosion may occur even if the set of all states reachable from the initial states of a model has a very compact representation if the subsets manipulated during reachability analysis do not have a compact representation. Intermediate results for subsets may be sets of transitions rather than sets of states. The BDDs for transitions are often an order of magnitude larger than those for the state sets.

To reduce the likelihood of "state explosion" during the reachability analysis, flexibility in the search strategy may be introduced by abandoning a strict BFS strategy. Instead, the states to be explored are chosen so as to keep their representation manageable. In another approach, disjunctive decomposition may be applied to the image computation. In these cases, the focus is on reducing the size of the intermediate BDDs of image computation. Partitioning affects the sizes of all BDDs involved in the computation, including the set of states whose image is computed, the transition relation, and the intermediate results.

The methods proposed for disjunctive partitioning can be classified according to the criteria that guide the decomposition of the computation. One approach is to identify state variables that lead to an orthonormal decomposition of the characteristic functions such that the sizes of the components are heuristically minimized. Another approach looks at the dependencies in the transition relation and partitions either with the intent of breaking such dependencies or to restrict them inside the component blocks.

There is a need in the art for improved techniques for partitioning a program for reachability analysis.

SUMMARY

Provided are a method, system, and article of manufacture for verification of a program partitioned according to the control flow information of the program. Properties are received indicating outcome states for a program. The program is processed to determine a control flow in the program and paths in the control flow. Enabled paths are determined in the control flow having states satisfying requirements of the outcome states. For each enabled path, a determination is made of inert variables not used along the control flow of the path and a representation of states and transitions for the enabled path is generated, wherein the represented states and transitions do not include the inert variables. The generated representation of the states and transitions for the enabled path are combined into a merged computation image.

BRIEF DESCRIPTION OF THE DRAWINGS

FIG. 2 illustrates an example of a Verilog program.

DETAILED DESCRIPTION

Figure 1:
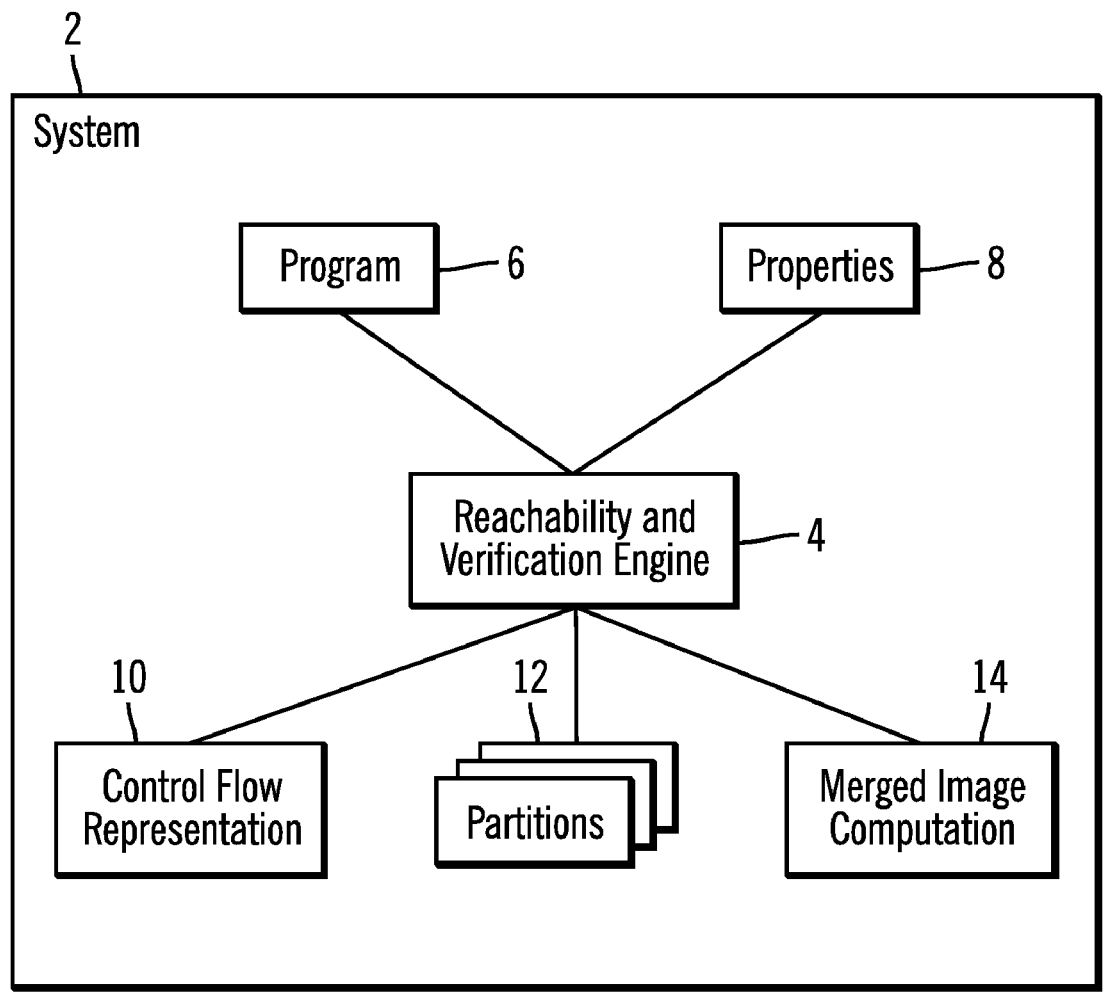
FIG. 1 illustrates an embodiment of a computing environment.

FIG. 1 illustrates an embodiment of a computing environment including a system 2 having a reachability and verification engine 4 that receives as input a program 6, such as a Verilog or other language program, and properties 8 indicating values of variables or registers that must hold, i.e., a required state, or must not occur, i.e., a forbidden state, in the program 6. The reachability and verification engine 4 generates a control flow representation 10, such as a control flow graph, from the program that is a directed graph representing the flow of control of the program 6. From the control flow representation 10, the reachability and verification engine 4 uses control flow analysis to generate partitions 12, where each partition 12 comprises a finite state machine representing states and transitions for a single path defined in the control flow representation 10. The partitions 12 provide a disjunctive partitioning of the control flow of the program 6. A merged image computation 14 comprises is formed from the states and transitions for all the paths in the program control flow representation 10. The merged image computation 14 comprises the state and transition results for a single BFS step.

Formal verification or model checking is then performed on the merged image computation 14 using the provided properties 8 to determine the extent to which the variable states in the image computation 14 satisfy any required or forbidden outcomes or values indicated in the properties 8.

FIG. 2 illustrates an example of a computer program, such as program 6, including predicates or conditional statements, P1-P4, and states S1-S8 representing states that occur at certain decision node predicates. Thus, the nodes may be an assignment or a transition/decision.

Figure 3:
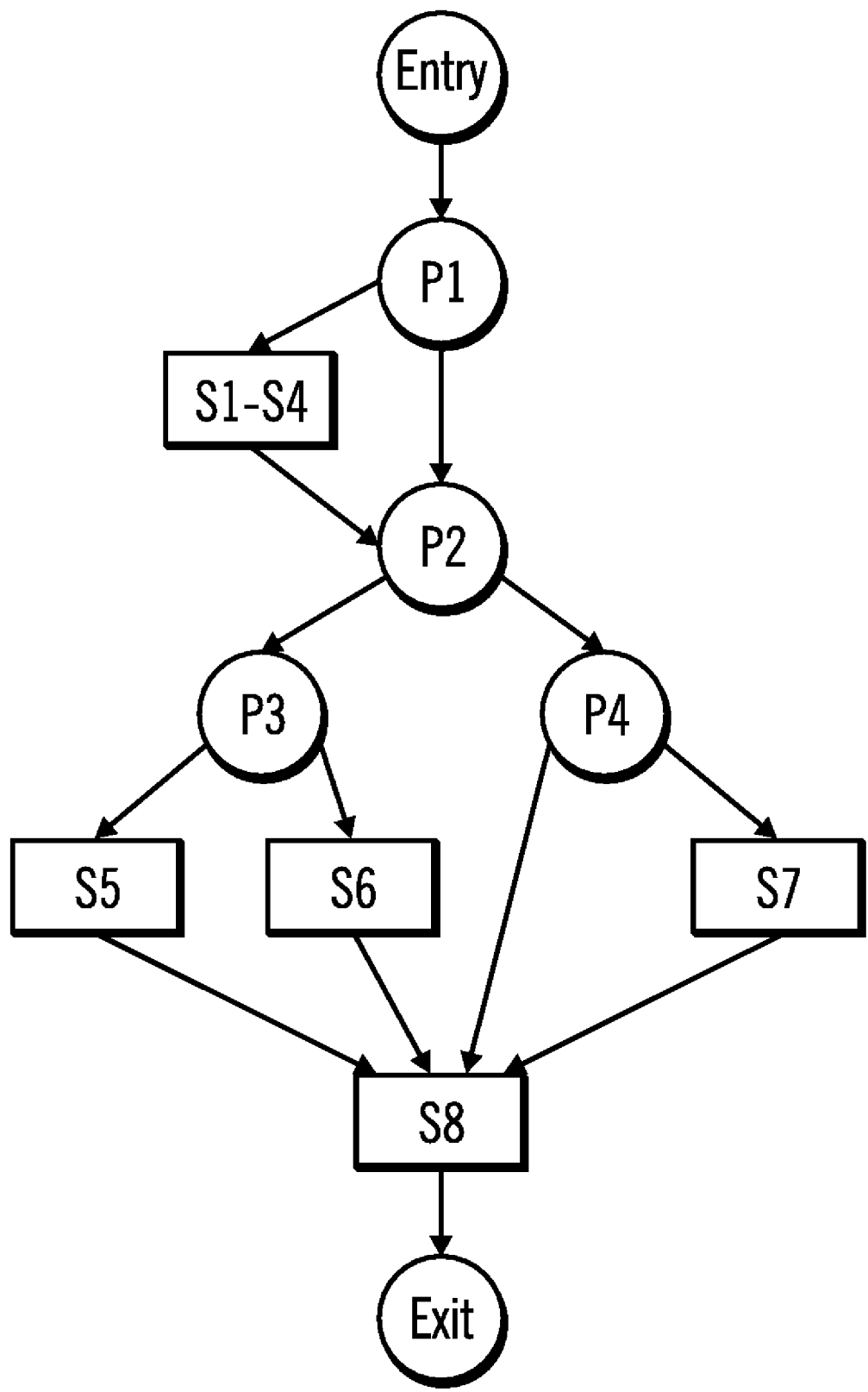
FIG. 3 illustrates an example of a control flow graph generated from the Program in FIG. 2.

FIG. 3 illustrates an example of a control flow graph for the program of FIG. 2. Each node represents an assignment or branching statement. Each directed arc represents flow of control from one node to another.

Figure 4:
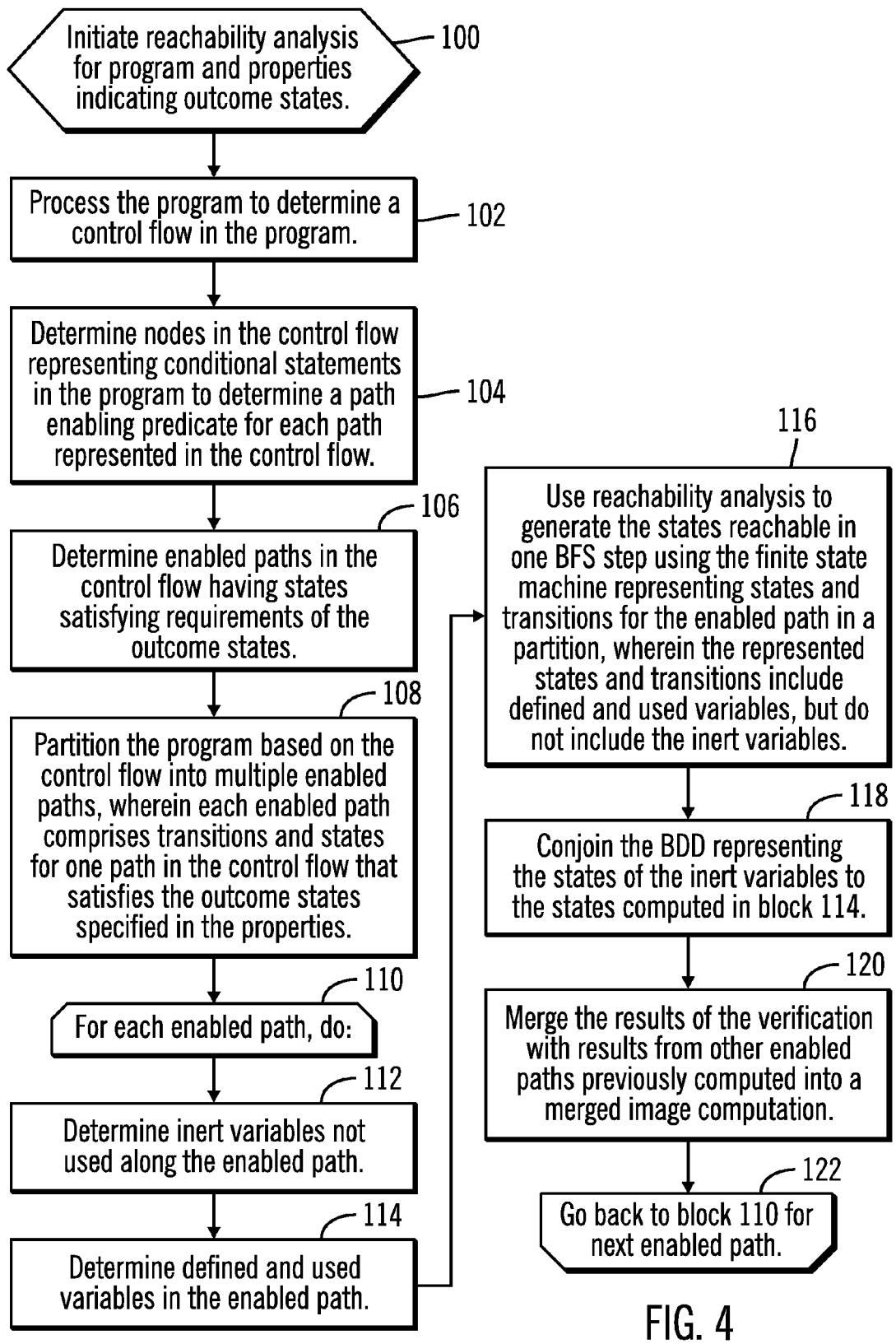
FIG. 4 illustrates an embodiment of operations to perform reachability analysis and formal verification.

FIG. 4 illustrates an embodiment of operations performed by the reachability and verification engine 4 to perform reachability analysis and verification of the program 6 based on the properties 8. Upon initiating (at block 100) the reachability analysis and formal verification of program 6, the reachability and verification engine 4 processes (at block 102) the program 6 to determine the control flow of the program, such as control flow representation 10. The control flow representation 10 can be extracted in a single pass traversal over the program 6. In an embodiment where the program 6 comprises a Verilog program, the reachability and verification engine 4 may create a control flow representation for each block, such as a Verilog always block. The set of control flow graph paths in the program consisting of multiple always blocks is the Cartesian product of the set of paths computed from each always block control flow graph. In one embodiment, the paths in the program 6 may be determined by enumerating all possible paths, which could result in $2^n$ paths, where n is the number of decisions in the program 6 text.

In a further embodiment, a Binary Decision Diagram (BDD) based traversal algorithm may be used to compute the paths in the program. A BDD comprises a graphical representation of Boolean functions and is derived from a binary decision tree by merging isomorphic subgraphs and eliminating redundant nodes. For a given variable order, the derivation results in a canonical representation. Large sets can be manipulated via their characteristic functions, which in turn can be represented by BDDs. BDDs are used to represent sets of states and transitions in symbolic model checking.

A BDD traversal may determine each path in the control flow by computing each path's enabling predicate. The path enabling predicate may comprise the conjunction of the predicates along the path. With this algorithm, as false paths are identified (i.e., a path whose predicate is false), they are eliminated from subsequent iterations thus decreasing the number of paths that need to be checked for falsehood in subsequent steps. The set of path enabling predicates may be computed while parsing the program 6 text without having to build the program control flow graph.

The reachability and verification engine 4 may determine (at block 104) the nodes in the control flow representing conditional statements in the program to determine a path enabling predicate for each path represented in the control flow. As discussed, this determination may be made using a BDD algorithm. The reachability and verification engine 4 then determines (at block 106) enabled paths in the control flow having states satisfying requirements of the outcome states. The enabled paths may be determined by conjoining the indicated outcome states, indicating states that cannot occur or that must occur, with the path enabling predicates to determine paths that satisfy the conditions of the outcome states. In this way, the enabled paths comprise those path that satisfy the received properties 8.

The control flow may then be partitioned (at block 106) into multiple enabled paths, wherein each enabled path comprises transitions and states for one path in the control flow that satisfies the outcome states specified in the properties. The information about each enabled path includes the path enabling predicate, which is the conjunction of all the conditionals that are true along the path (i.e., the conditional expressions controlling program flow) along with the path itself, and the set of variables, which may include registers, that are defined and used along the path. The path enabling predicates may depend on both state variables and primary inputs. The path control information can be used for disjunctive partitioning to form the partitions 12, which each of the information for one enabled path in the control flow.

The reachability and verification engine 4 may perform a loop (at blocks 110 through 122) of operations 110 through 118 for each enabled path in the control flow. Paths that do not satisfy the required outcomes of the received properties 8 are disabled and not considered in the loop at blocks 110 to 122. The inert, defined and used variables in the enabled path are determined (at block 110 and 112). A variable is defined along the enabled path if it is the target of at least one assignment along the enabled path. A variable is used along the enabled path if it is not defined and it appears on the right-hand side of an assignment or in a conditional along the enabled path. A variable is inert if it is neither defined nor used along the enabled path.

The reachability and verification engine 4 may then use reachability analysis to generate (at block 114) the states reachable in one BFS step using the finite state machine representing states and transitions for the path in the form of partitions 12, wherein the represented states and transitions include defined and used variables, but do not include the inert variables. The finite state machine may be generated using a symbolic reachability algorithm with disjunctive image partitioning based on the control flow graph 10, which finds all states that are reachable from some state in the initial state set for each enabled path. The finite state machine may be represented by BDDs, comprising graphical representations of Boolean functions. In this way, the reachability analysis is performed with respect to a specific enabled path 12, excluding the inert variables from the states represented in the finite state machine. In this way, the function or logic that represents a transition and state for an inert variable is removed from the representation.

The values of the inert variables are then conjoined (at block 116) with the set of states computed during the image computation at block 114 to provide all the states for that enabled path in the partition 12, inert as well as non-inert, e.g., defined and used variables.

The states determined at block 116 are then merged (at block 118) into a merged computation image 14, having the states and variables for all enabled paths processed so far in the loop. The generated merged computation image 14 has the states and transitions for the paths in the program that satisfy the outcome states required in the properties. As discussed, the properties 8 may indicate forbidden or required states for different variables.

Described embodiments optimize the computing required for the reachability analysis by performing the reachability analysis with respect to partitions and enabled, where each partition comprises a single enabled path in the control flow. In further embodiments, computation is optimized by removing inert states and variables from the finite state machine generated for each path. For instance, the partitioning of the reachability analysis decreases dependencies in the transition relation and simplifies the states and transitions represented.

Additional Embodiment Details

The described operations may be implemented as a method, apparatus or article of manufacture using standard programming and/or engineering techniques to produce software, firmware, hardware, or any combination thereof. The described operations may be implemented as code maintained in a "computer readable medium", where a processor may read and execute the code from the computer readable medium. A computer readable medium may comprise media such as magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), etc. The code implementing the described operations may further be implemented in hardware logic (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The transmission signals in which the code or logic is encoded is capable of being transmitted by a transmitting station and received by a receiving station, where the code or logic encoded in the transmission signal may be decoded and stored in hardware or a computer readable medium at the receiving and transmitting stations or devices. An "article of manufacture" comprises computer readable medium, hardware logic, and/or transmission signals in which code may be implemented. A device in which the code implementing the described embodiments of operations is encoded may comprise a computer readable medium or hardware logic. Of course, those skilled in the art will recognize that many modifications may be made to this configuration without departing from the scope of the present invention, and that the article of manufacture may comprise suitable information bearing medium known in the art.

Although, the finite state machine was described as represented by Boolean logic through BDD's and a symbolic reachability analysis, other suitable techniques known in the art may be used to generate the finite state machine.

Although the program subject to the reachability analysis and verification comprised a Verilog program in the described embodiments, the described reachability analysis and verification operations may be performed with respect to programs in languages other than Verilog.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the feature of a device may be alternatively embodied by one or more other devices which are not explicitly described as having such functionality/features. Thus, other embodiments of the present invention need not include the device itself.

The illustrated operations of FIG. 4 shows certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:
1. A method, comprising:
  receiving properties indicating outcome states for a program including a description representing a design of an integrated circuit;
  processing the program to determine a control flow in the program and paths in the control flow;
  determining enabled paths in the control flow having states satisfying requirements of the outcome states;
  for each enabled path, performing, a computer:
    determining inert variables not used along the control flow of the path;
    generating a representation of states and transitions for the enabled path, wherein the represented states and transitions do not include the inert variables; and
    combining the generated representation of the states and transitions for the enabled path into a merged computation image.

2. The method of claim 1, wherein processing the program to determine the control flow in the program comprises:
  determining nodes in the control flow representing conditional statements in the program to determine a path enabling predicate for each path represented in the control flow, wherein the path enabling predicate for one path is a conjunction of all the conditional statements that are true along the path.

3. The method of claim 2, wherein determining the enabled paths comprises conjoining the required outcome states with the path enabling predicates to determine the enabled paths whose path enabling predicates satisfy the required outcome states.

4. The method of claim 1, further performing, for each enabled path:
  determining defined variables in the enabled path, wherein each defined variable has at least one assignment along the enabled path, wherein the states and transitions for the enabled path include the defined variables.

5. The method of claim 1, further performing, for each enabled path:
  determining used variables in the path, where each used variable in the path is not defined and used in an assignment, wherein the inert variables are neither used nor defined in the enabled path, and wherein the transitions and states include the used variables.

6. The method of claim 1, wherein reachability analysis is used to generate a finite state machine representing the states and transitions in the enabled path.

7. The method of claim 1, wherein the representation of the states indicates values of variables used or altered through the transitions, and wherein each representation comprises a partition formed by a disjunctive partitioning of the control flow of the program.

8. The method of claim 7, further performing, for each path:
  conjoining values of the inert variables to the generated representation of the states and transitions in the enabled path, wherein the merged computation image includes states for those paths satisfying the required outcomes of the properties.

9. A system, comprising:
  a processor;
  a program including a description representing a design of an integrated circuit;
  code executed by the processor to perform operations, the operations comprising:
    receiving properties indicating outcome states for the program;
    processing the program to determine a control flow in the program and paths in the control flow;
    determining enabled paths in the control flow having states satisfying requirements of the outcome states;
    for each enabled path, performing:
      determining inert variables not used along the control flow of the path;
      generating a representation of states and transitions for the enabled path, wherein the represented states and transitions do not include the inert variables; and
      combining the generated representation of the states and transitions for the enabled path into a merged computation image.

10. The system of claim 9, wherein processing the program to determine the control flow in the program comprises:
  determining nodes in the control flow representing conditional statements in the program to determine a path enabling predicate for each path represented in the control flow, wherein the path enabling predicate for one path is a conjunction of all the conditionals that are true along the path.

11. The system of claim 9, wherein the operations further perform, for each enabled path:
  determining defined variables in the enabled path, wherein each defined variable has at least one assignment along the enabled path, wherein the states and transitions for the enabled path include the defined variables.

12. The system of claim 9, wherein the operations further perform, for each path:
  adding values of the inert variables to the generated representation of the states and transitions in the enabled path, wherein the merged computation image includes states for those paths satisfying the required outcomes of the properties.

13. An article of manufacture comprising a computer readable storage device implementing code to analyze a program, wherein the code is enabled to cause operations to:
  receive properties indicating outcome states for the program including a description representing a design of an integrated circuit;
  process the program to determine a control flow in the program and paths in the control flow;
  determine enabled paths in the control flow having states satisfying requirements of the outcome states;
  for each enabled path, perform:
  determine inert variables not used along the control flow of the path;
  generate a representation of states and transitions for the enabled path, wherein the represented states and transitions do not include the inert variables; and
  combine the generated representation of the states and transitions for the enabled path into a merged computation image.

14. The article of manufacture of claim 13, wherein the processing of the program to determine the control flow in the program comprises:
  determining nodes in the control flow representing conditional statements in the program to determine a path enabling predicate for each path represented in the control flow, wherein the path enabling predicate for one path is a conjunction of all the conditional statements that are true along the path.

15. The article of manufacture of claim 14, wherein the determining of the enabled paths comprises conjoining the required outcome states with the path enabling predicates to determine the enabled paths whose path enabling predicates satisfy the required outcome states.

16. The article of manufacture of claim 13, wherein the operations further perform, for each enabled path:
  determine defined variables in the enabled path, wherein each defined variable has at least one assignment along the enabled path, wherein the states and transitions for the enabled path include the defined variables.

17. The article of manufacture of claim 13, wherein the operations further perform, for each enabled path:
  determine used variables in the path, where each used variable in the path is not defined and used in an assignment, wherein the inert variables are neither used nor defined in the enabled path, and wherein the transitions and states include the used variables.

18. The article of manufacture of claim 13, wherein reachability analysis is used to generate a finite state machine representing the states and transitions in the enabled path.

19. The article of manufacture of claim 13, wherein the representation of the states indicates values of variables used or altered through the transitions, and wherein each representation comprises a partition formed by a disjunctive partitioning of the control flow of the program.

20. The article of manufacture of claim 19, wherein the operations further perform, for each path:

conjoin values of the inert variables to the generated representation of the states and transitions in the enabled path, wherein the merged computation image includes states for those paths satisfying the required outcomes of the properties.

* * * * *